US006683478B2

(12) United States Patent
Yoo

(10) Patent No.: US 6,683,478 B2
(45) Date of Patent: Jan. 27, 2004

(54) APPARATUS FOR ENSURING CORRECT START-UP AND PHASE LOCKING OF DELAY LOCKED LOOP

(75) Inventor: Chang-sik Yoo, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/012,831

(22) Filed: Nov. 13, 2001

(65) Prior Publication Data

US 2003/0090296 A1 May 15, 2003

(51) Int. Cl.[7] .............................................. H03D 13/00
(52) U.S. Cl. ....................................................... 327/12
(58) Field of Search ............................. 327/12, 1, 2, 3, 327/5, 7, 8, 9, 10, 42, 43, 156, 159, 162, 163; 331/25

(56) References Cited

U.S. PATENT DOCUMENTS

| 4,105,947 A | * | 8/1978 | Crowley ..................... 331/1 A |
| 5,347,559 A | | 9/1994 | Hawkins et al. .............. 377/54 |
| 5,539,345 A | * | 7/1996 | Hawkins ..................... 327/150 |
| 5,663,665 A | | 9/1997 | Wang et al. .................... 327/3 |
| 5,740,213 A | | 4/1998 | Dreyer ........................ 375/374 |
| 5,892,380 A | | 4/1999 | Quist .......................... 327/172 |
| 5,923,715 A | | 7/1999 | Ono ............................ 375/376 |
| 5,936,430 A | * | 8/1999 | Patterson ....................... 327/12 |
| 5,939,901 A | * | 8/1999 | Geddes ........................... 327/3 |
| 6,127,897 A | | 10/2000 | Sasaki ........................... 331/25 |
| 6,150,889 A | | 11/2000 | Gulliver et al. ................ 331/14 |
| 6,157,218 A | * | 12/2000 | Chen ............................... 327/7 |
| 6,192,094 B1 | * | 2/2001 | Herrmann et al. ........... 375/375 |
| 6,215,343 B1 | | 4/2001 | Birru ........................... 327/158 |
| 6,617,884 B2 | * | 9/2003 | Wang et al. ................... 327/12 |

* cited by examiner

Primary Examiner—My-Trang Nu Ton
(74) Attorney, Agent, or Firm—Mills & Onello, LLP

(57) ABSTRACT

A phase detector system and method operate correctly, regardless of the point of time at which the operation of the delay locked loop is initialized with respect to the phases of reference and feedback clock signals. The system comprises a phase detector for a delay-locked loop for compensating for a difference in phase between a first clock signal and a second clock signal. The phase detector includes a first flip-flop receiving the first clock signal and generating a first output signal, the first flip-flop being reset by a first reset signal. A second flip-flop receives the reference clock signal and generates a second output signal, the second flip-flop being reset by a second reset signal, the first and second reset signals being sourced by separate logic paths. A reset circuit generates the first reset signal based on a combination of the first and second output signals and a first initialization signal, and generates the second reset signal based on a combination of the first and second output signals and a second initialization signal.

24 Claims, 14 Drawing Sheets

US 6,683,478 B2

APPARATUS FOR ENSURING CORRECT START-UP AND PHASE LOCKING OF DELAY LOCKED LOOP

FIELD OF THE INVENTION

The present invention relates to a phase detector employed in a delay locked loop which delays an input reference clock signal by a predetermined time period. More specifically, the present invention is directed to a phase detector that maintains proper operation regardless of the point in time at which the operation of the delay locked loop is initiated.

BACKGROUND OF THE INVENTION

Delay locked loops (DLLs) are used extensively in the field of analog circuit design. With the increasingly stringent timing requirements of current high-performance computing and communication systems, DLLs are becoming more popular for use in digital circuit designs (e.g., computer motherboards, high performance multimedia boards, semiconductor memory devices, etc.). Particularly, DLLs are being used in semiconductor memory devices such as double data rate (DDR) DRAM to achieve a common phase between an input reference clock signal and an internal clock signal.

Referring to FIG. 1, a delay locked loop 1 includes a voltage controlled delay line (VCDL) 10, a phase detector 20, a charge pump 30, a capacitor C1 operating as a filter, and an optional delay unit 40. The following description assumes the delay unit 40 is included in the delay locked loop.

The phase detector 20 measures the phase difference between an input reference clock signal REFCLK and an feedback clock signal FBCLK output from the delay unit 40, and outputs phase difference detection signals UP and DOWN. The charge pump 30 controls an amount of output current Ic in response to the detection signals UP and DOWN. The capacitor C1 provides the VCDL 10 with a control voltage Vc corresponding to the current Ic output from the charge pump 30. The VCDL 10 delays the reference clock signal REFCLK by an amount of time corresponding to the control voltage Vc, and outputs a clock signal OUTCLK that is a delayed signal of the REFCLK. The delay unit 40 delays the clock signal OUTCLK output from the VCDL 10 by a predetermined time, and outputs a delayed signal of the OUTCLK so as to compensate for the phase difference between the OUTCLK and the REFCLK.

When a master reset signal RESETB is activated, the DLL 1 operates as follows. The RESETB signal has a high logic value when the DLL 1 is in operation. The phase detector 20 detects a phase difference between the input reference clock signal REFCLK and the feedback clock signal FBCLK output from the delay unit 40. When the phase of the feedback clock signal FBCLK lags behind a phase of the reference clock signal REFCLK (or, the phase of REFCLK leads that of the FBCLK), the phase difference detection signal UP is enabled. Thus, the charge pump 30 provides output current Ic such that the delay time of the VCDL 10 is shortened. On the other hand, when the phase of the FBCLK leads the phase of the REFCLK (or, the phase of REFCLK lags behind that of the FBCLK), the phase difference detection signal DOWN is enabled. Thus, the charge pump 30 provides output current Ic so as to prolong the delay time of the VCDL 10. As a result, the DLL 1 delays the reference clock signal REFCLK by the time period set in the VCDL to output an output clock signal OUTCLK.

Referring now to FIG. 2, the phase detector includes two D flip-flops 21 and 22 and a reset control circuit 23.

The D flip-flop 21 includes an input terminal D coupled to a power supply voltage VCC, an output terminal Q outputting the phase difference detection signal UP, a clock terminal CK receiving the reference clock signal REFCLK, and a reset terminal RST.

The D flip-flop 22 includes an input terminal D coupled to the power supply voltage VCC, an output terminal Q outputting the phase difference detection signal DOWN, a clock terminal CK receiving a feedback clock signal FBCLK, and a reset terminal RST receiving a control signal A0 output from the reset control circuit 23.

The reset control circuit 23 is composed of a NAND gate 25 receiving the phase difference detection signals UP and DOWN to perform a NAND operation, and a NAND gate 24 receiving an output signal of the NAND gate 25 and an externally input master reset signal RESETB to perform an NAND operation.

The operation of the conventional phase detector will be described hereinafter with reference to the attached timing diagrams of FIGS. 3A–B and FIGS. 4A–4D. FIG. 3A and FIG. 3B are timing charts illustrating the operation state of the phase detector 20 shown in FIG. 2 while the DLL 1 of FIG. 1 operates in a steady state. Specifically, FIG. 3A is a timing chart illustrating the states of phase difference detection signals UP and DOWN output from the phase detector 20 when the phase of the feedback clock signal FBCLK leads the phase of the reference clock signal REFCLK.

Referring now to FIG. 2 and FIG. 3A, when a phase of the feedback clock signal FBCLK leads a phase of the reference clock signal REFCLK with the master reset signal RESETB remaining high, the phase detection signal DOWN is synchronized with the FBCLK, so as to be enabled first. Thereafter, the phase detection signal UP is enabled in synchronization with the REFCLK. When both UP and DOWN signals are enabled, the NAND gate 25 in the reset control circuit 23 outputs a low level signal. Accordingly, the signal A0 output from the NAND gate 24 goes high. Both D flip-flops 21 and 22 are then reset, allowing both of the UP and DOWN signals to transition to low. There is a simultaneous period of time when the detection signals UP and DOWN output from the phase detector 20 are both enabled. However, since the period of time that the DOWN signal is enabled is longer than the period of time that the UP signal is enabled, the charge pump 30 provides output current Ic such that the delay time of the VCDL 10 increases in proportion to the time difference between the UP and DOWN signals.

FIG. 3B is a timing chart illustrating the states of phase difference detection signals UP and DOWN output from the phase detector 20 when the phase of the feedback clock signal FBCLK lags behind the phase of the reference clock signal REFCLK. Referring to FIG. 2 and FIG. 3B, when the phase of the FBCLK signal lags behind that of the REFCLK signal with the master reset signal RESETB at a high level, the phase detection signal UP is initially enabled in synchronization with the REFCLK signal. The phase detection signal DOWN is then enabled in synchronization with the FBCLK. When both the UP and DOWN signals are enabled, the NAND gate 25 in the reset control circuit 23 outputs a low level signal. Thus, the A0 signal output from the NAND gate 24 transitions to high. As both of the D flip-flops 21 and 22 are reset in response to the high level of the A0 signal, both the UP and DOWN signals transition to low. There is a period of time during which both the UP and DOWN signals output from the phase detector 20 are enabled. Nevertheless, since the enable period of the UP signal is longer than the enable period of the DOWN signal, the charge pump 30 provides output current Ic such that the delay time of the VCDL 10 is shortened in proportion to the time corresponding to the difference in time duration between the UP and DOWN signals.

Although not shown in the drawings, when there is no phase difference between the FBCLK and REFCLK, the enabled periods of the UP and DOWN signals are identical to each other. Accordingly, the delay time of the VCDL 10 is not adjusted.

The phase detector 20 outputs phase detection signals UP and DOWN for increasing, shortening or maintaining the delay time of the VCDL 10. For this reason, the phase detector 20 is referred to as a three-state phase detector.

FIG. 4A and FIG. 4B are timing charts illustrating operation states of the phase detector shown in FIG. 2 when the DLL 1 of FIG. 1 is changed, or initialized, from a non-operation state to an operation state. Specifically, FIG. 4A is a timing chart of signals output from the phase detector 20 in the case where the master reset signal RESETB is enabled before the feedback clock signal FBCLK is enabled, when the phase of the FBCLK leads the phase of the reference clock signal REFCLK.

In FIG. 4A, an A0 signal output from the NAND gate 24 of the reset control circuit 23 transitions high while the master reset signal RESETB is maintained at a low level (i.e., the DLL 1 is maintained in an non-operation state). Thus, the phase detection signals DOWN and UP output from the D flip-flops 21 and 22 are maintained at a low level. With a low-to-high transition of the master reset signal RESETB (i.e., DLL 1 is activated), the NAND gate 24 in the reset control circuit 23 outputs a low level signal A0. Thus, the D flip-flops 21 and 22 are synchronized with the reference clock signal REFCLK and the feedback clock signal FBCLK, respectively.

As shown in FIG. 4A, after the master reset signal RESETB transitions to high, the feedback clock signal FBCLK transitions to high in advance of the reference clock signal REFCLK. The phase difference detection signal DOWN output from the D flip-flop 22 is enabled at a high level. Next, the phase difference detection signal UP output from the D flip-flop 21 is enabled at a high level when the REFCLK transitions to high. When both the UP and DOWN signals are enabled, the A0 signal output from the NAND gate 24 in the reset control signal 23 goes high.

FIG. 4C is a timing chart of signals of the phase detector 20 in the case where the master reset signal RESETB is enabled before the reference clock signal REFCLK is enabled, when the phase of the feedback clock signal FBCLK lags behind the phase of the REFCLK signal.

In FIG. 4C, since the A0 signal output from the NAND gate 24 is maintained at a high level when the master reset signal RESETB is maintained at a low level, both the phase detection signals UP and DOWN output from the D flip-flops 21 and 22 retain a low level. With a low-to-high transition of the master reset signal RESETB, a signal output from the NAND gate 24 transitions from high to low. Since the REFCLK transitions to high in advance of the FBCLK after the RESETB transitions to high, a phase detection signal UP output from the D flip-flop 21 is enabled at a high level. When the FBCLK is later enabled, the phase detection signal DOWN is enabled. When both the UP and DOWN signals are enabled, the A0 signal output from the NAND gate 24 transitions to high.

As mentioned above, if the master clock signal RESETB is enabled before the phase-leading one of the REFCLK and FBCLK signals is enabled, the phase detector 20 operates in normal fashion. However, if the RESETB signal is enabled between the enable time of the leading-phase signal and the enable time of the lagging-phase clock signal, the phase detector 20 malfunctions, as the output may have an incorrect value.

FIG. 4B is a timing chart for illustrating abnormal operation of the conventional phase detector 20 when the phase of the feedback clock signal FBCLK leads the phase of the reference clock signal REFCLK under the condition that the master reset signal RESETB is enabled. Referring to FIG. 2 and FIG. 4B, if the master reset signal RESETB is enabled between respective rising edges of the FBCLK and REFCLK when the phase of the FBCLK leads that of the REFCLK, the phase difference detection signal UP output from the D flip-flop 21 is enabled in synchronization with the REFCLK. When the FBCLK is enabled, the phase difference detection signal DOWN output from the D flip-flop 22 is enabled.

When the phase of the feedback clock signal FBCLK leads the phase of the reference clock signal REFCLK, the phase difference detection signal DOWN should be enabled prior to the phase difference detection signal UP. Unfortunately, in the example of the conventional phase detector 20 given in FIG. 4B, because the UP signal is first enabled under these conditions, the phase detector 20 malfunctions by decreasing the delay, rather than increasing the delay.

FIG. 4D is a timing chart for illustrating a further malfunction condition of the conventional phase detector of FIG. 2. If the master reset signal RESETB is enabled between the enable time of the reference clock signal REFCLK and the pre-enable time of the feedback clock signal FBCLK when the phase of the FBCLK lags behind the phase of the reference clock signal REFCLK, the phase difference detection signal DOWN output from the D flip-flop 22 is enabled in synchronization with the FBCLK. When the REFCLK is enabled, the UP signal output from the D flip-flop 21 is enabled.

When the phase of the feedback clock signal FBCLK lags behind the phase of the reference clock signal REFCLK, the phase difference detection signal UP should be enabled prior to the phase difference detection signal DOWN. Unfortunately, in the conventional phase detector 20 as illustrated in FIG. 4D, if the DOWN signal is first enabled, the phase detector 20 again malfunctions in this case, by increasing the delay, rather than decreasing the delay.

SUMMARY OF THE INVENTION

It is an object of the present invention to provide a phase detector system and method which operate correctly, regardless of the point of time at which the operation of the delay locked loop is initialized with respect to the phases of the reference and feedback clock signals.

In one aspect, the system of the present invention comprises a phase detector for a delay-locked loop for compensating for a difference in phase between a first clock signal and a second clock signal. The phase detector includes a first flip-flop receiving the first clock signal and generating a first output signal, the first flip-flop being reset by a first reset signal. A second flip-flop receives the second clock signal and generates a second output signal, the second flip-flop being reset by a second reset signal, the first and second reset signals being sourced by separate logic paths. A reset circuit generates the first reset signal based on a combination of the first and second output signals and a first initialization signal, and generates the second reset signal based on a combination of the first and second output signals and a second initialization signal.

In one embodiment, the first and second initialization signals are complementary during an initialization procedure. The first clock may comprise a reference clock and the second clock may comprise a feedback clock. The first output signal may comprises an UP signal which is used in the delay-locked loop to decrease the delay of the first clock signal and the second output signal may comprise a DOWN signal which is used in the delay-locked loop to increase the delay of the first clock signal.

In another embodiment, the reset circuit comprises a first logic circuit for performing a logic operation on the first and second output signals to provide a first intermediate signal. A second logic circuit performs a logic operation on the first intermediate signal and the first initialization signal to generate the first reset signal. A third logic circuit performs a logic operation on the first intermediate signal and the second initialization signal to generate the second reset signal.

In yet another embodiment, an initialization circuit generates the first and second initialization signals. A third flip-flop receives the first and second clock signals and generates a second intermediate signal. A fourth logic circuit performs a logic operation on the second intermediate signal and an externally generated master reset signal to generate the first initialization signal. A fifth logic circuit performs a logic operation on the second intermediate signal and the externally generated master reset signal to generate the second initialization signal.

The first, second and third flip-flops preferably comprise a D flip-flops. The first clock signal may be coupled to a D input of the third D flip-flop and the second clock signal may be coupled to a clock input of the third D flip-flop. Alternatively, the second clock signal may be coupled to a D input of the third D flip-flop and the first clock signal may be coupled to a clock input of the third D flip-flop.

The first clock signal may be coupled to a clock input of the first D flip-flop and the second clock signal may be coupled to a clock input of the second D flip-flop. The D inputs of the first and second D flip-flops are each coupled to a voltage source representing a binary one.

BRIEF DESCRIPTION OF THE DRAWINGS

The invention will now be described in additional detail with reference to the attached drawings in which like reference numerals refer to the same components throughout the various figures.

DETAILED DESCRIPTION OF THE PREFERRED EMBODIMENT

Figure 5:
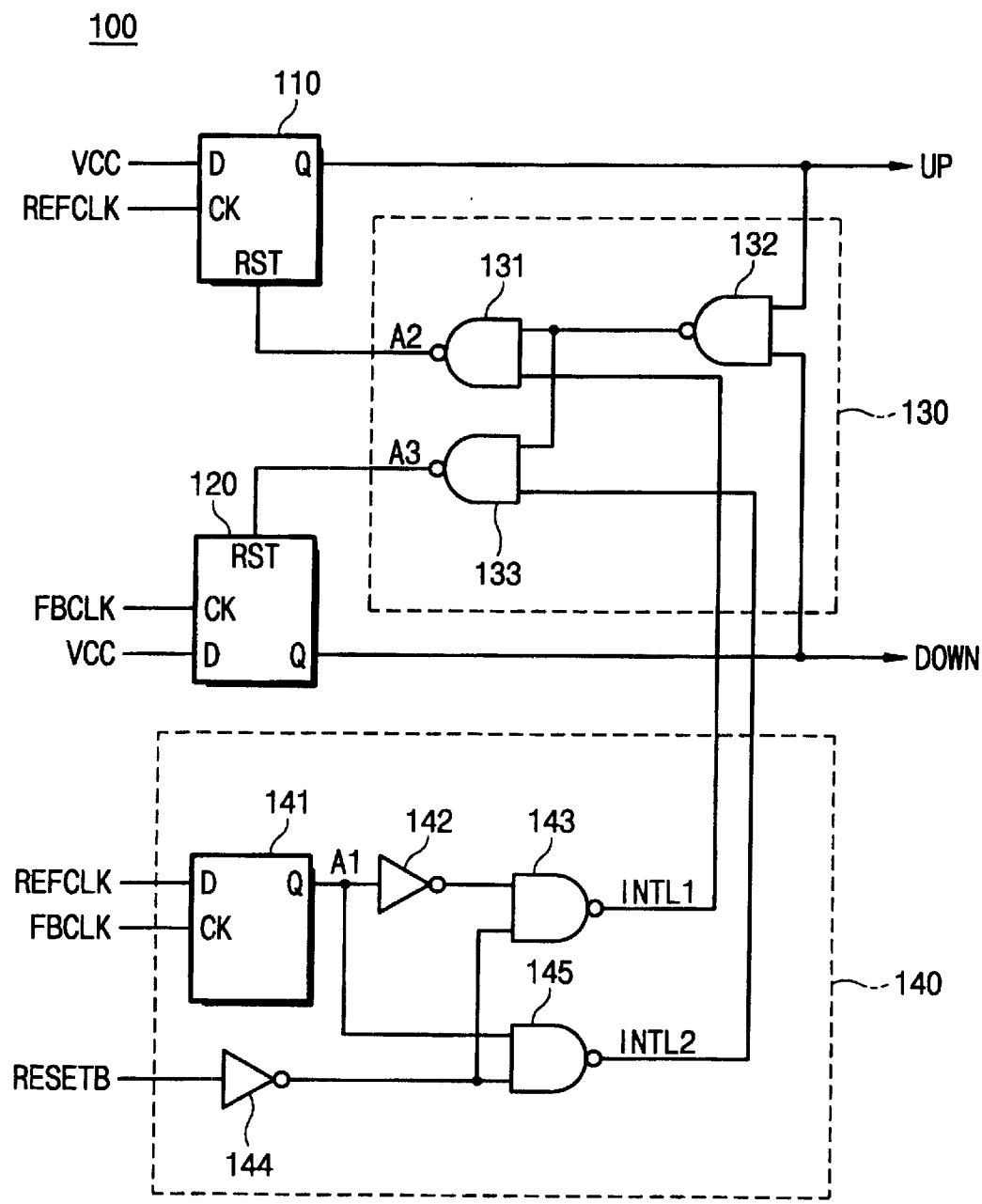
FIG. 5 is a schematic diagram showing a configuration of a phase detector according to the preferred embodiment of the present invention.

A configuration of a phase detector according to the preferred embodiment of the present invention is illustrated in FIG. 5. A phase detector 100 includes D flip-flops 110 and 120 each outputting phase detection signals UP and DOWN, a reset control logic 130 outputting independent and separate reset signals A2 and A3 for controlling the reset of the D flip-flops 110, 120, and an initial state-setting logic 140 generating initial state setting signals INTL1 and INTL2 for setting the initial states of the UP and DOWN signals. The reset control circuit 130 is composed of NAND gates 131, 132, and 133. The initial state setting logic 140 includes a D flip-flop 141, NAND gates 143 and 145, and inverters 142 and 144.

Figure 2:
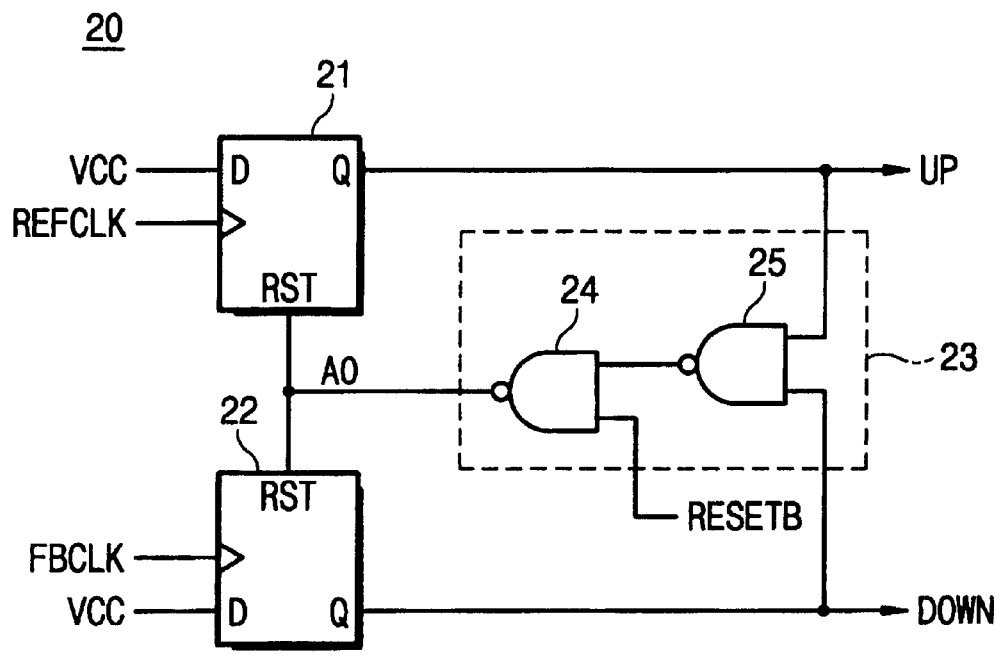
FIG. 2 is a diagram illustrating a circuit configuration of the phase detector of in FIG. 1.
Figure 3A:
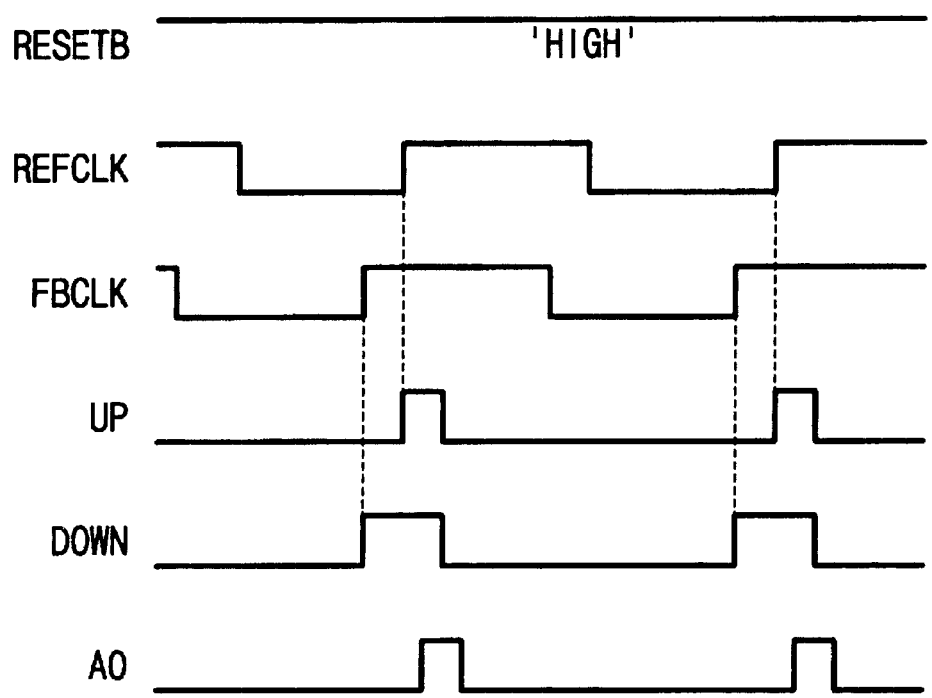
FIG. 3A and FIG. 3B are timing diagrams illustrating the operation state of the phase detector shown in FIG. 2 while the DLL shown in FIG. 1 operates in a stable state.
Figure 3B:
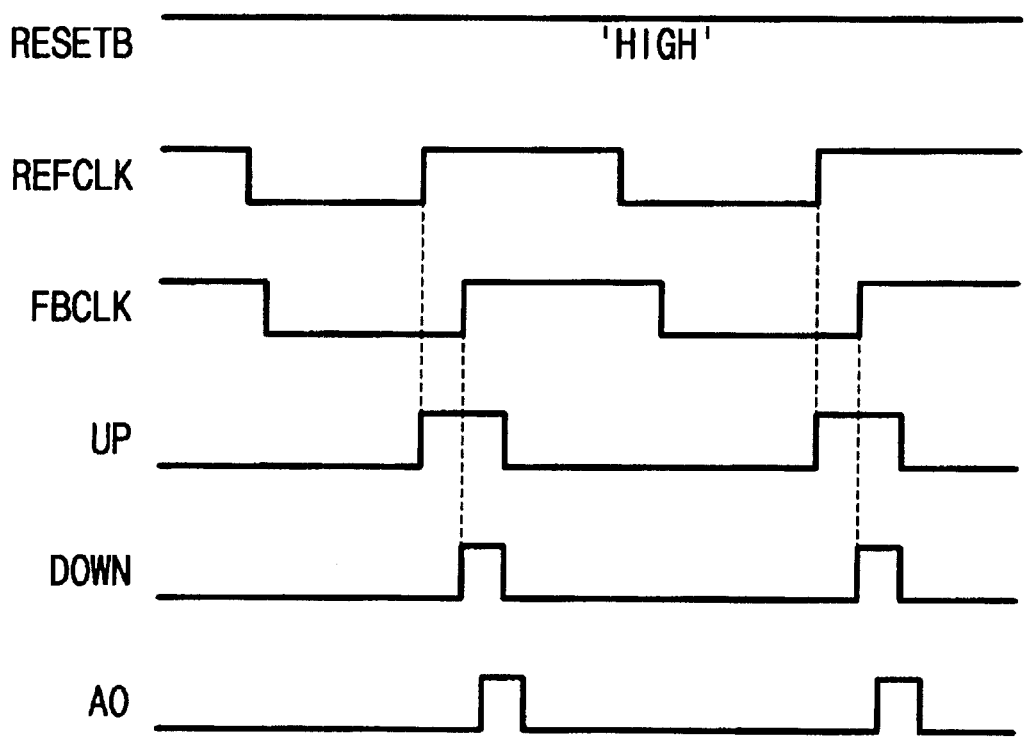
Figure 4A:
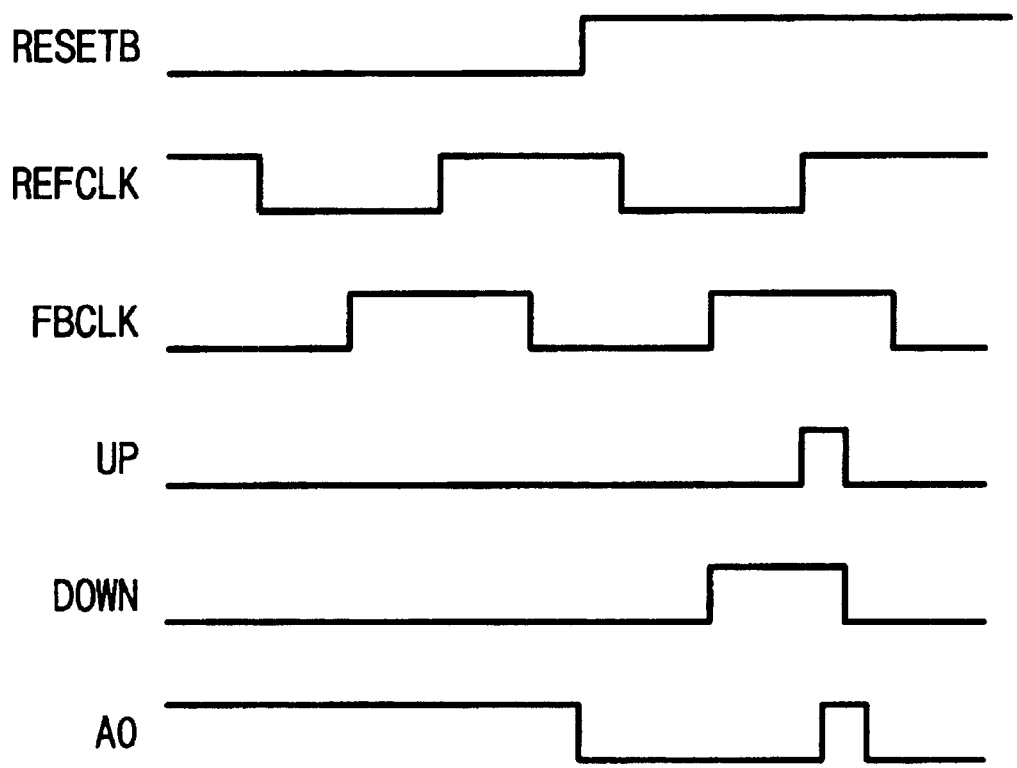
FIG. 4A through FIG. 4D are timing charts illustrating the operation state of the phase detector shown in FIG. 2 when the DLL shown in FIG. 1 is initialized from a non-operation state to an operation state.
Figure 4B:
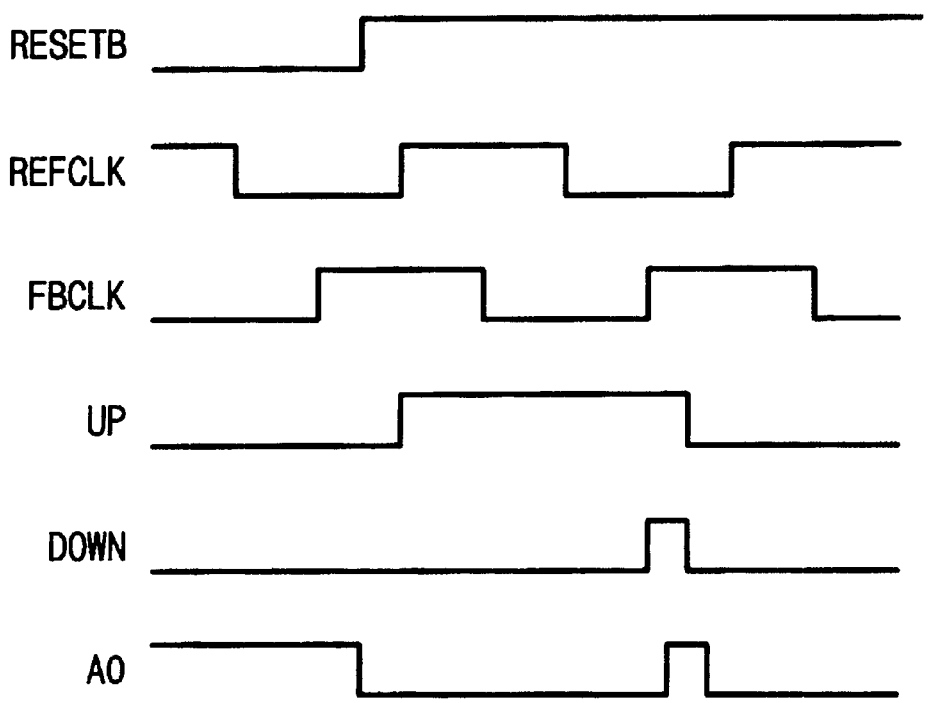
Figure 4C:
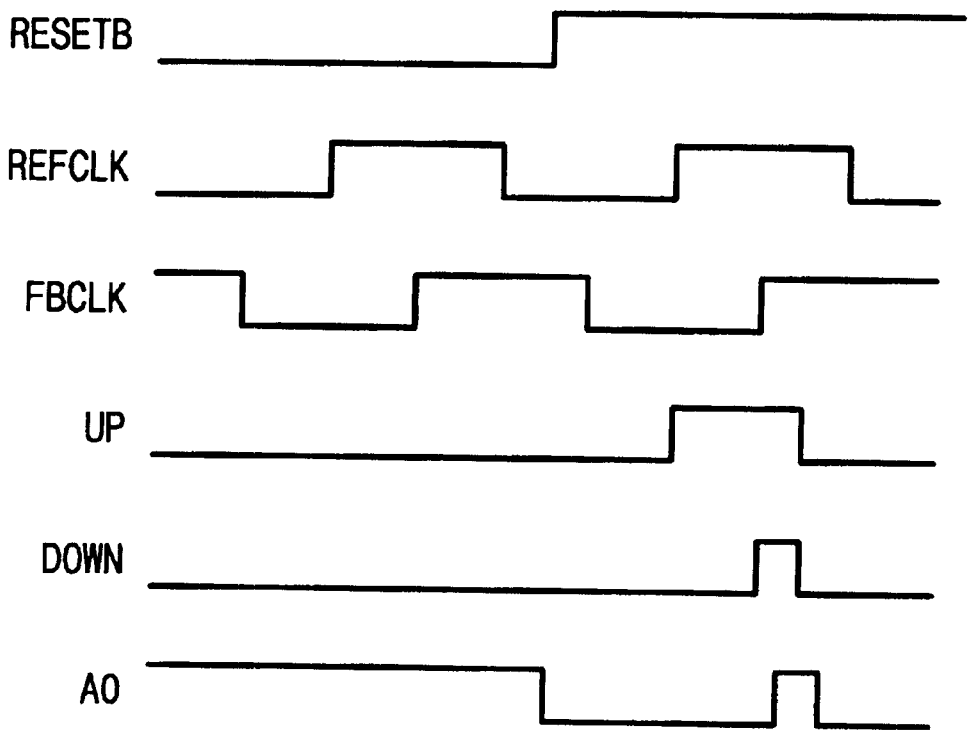
Figure 4D:
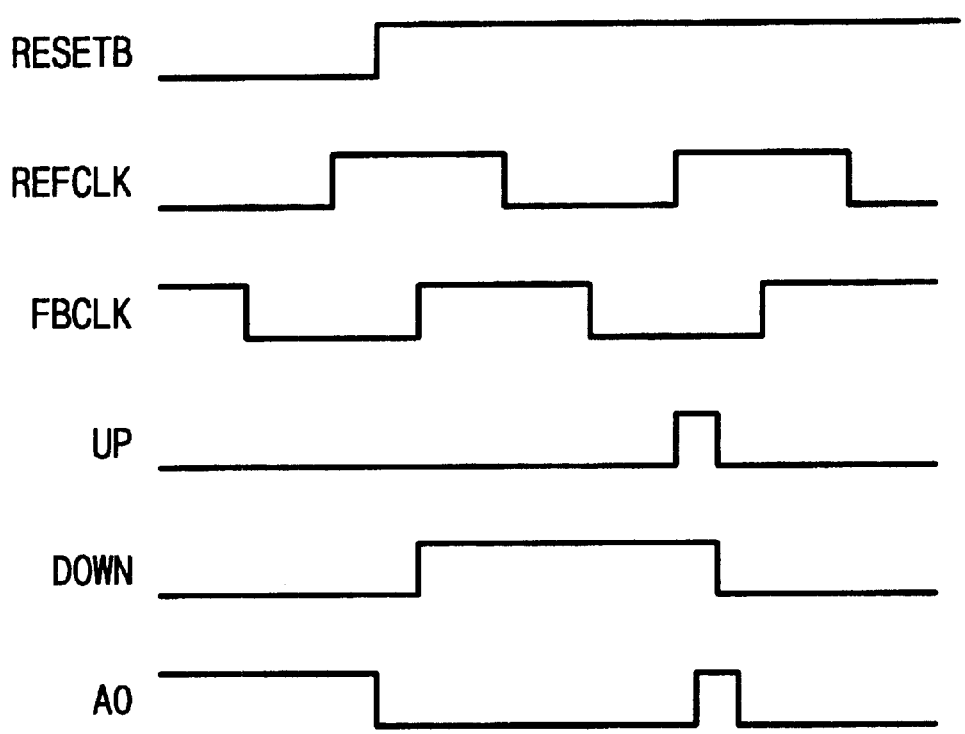

Each of the D flip-flops 110 and 120 has the same configuration as the D flip-flops 21 and 22 constructed in the conventional phase detector 20 shown in FIG. 2. That is, the D flip-flop 110 includes an input terminal D coupled to a power supply voltage VCC, an output terminal outputting the phase difference detection signal UP, a clock terminal CK receiving the reference clock signal REFCLK, and a reset terminal RST receiving the A2 signal output by the reset control signal logic 130.

The D flip-flop 120 includes an input terminal D coupled to the power supply voltage VCC, an output terminal Q outputting the phase difference detection signal DOWN, a clock terminal CK receiving a feedback clock signal FBCLK, and a reset terminal RST receiving a signal A3 output by the reset control circuit logic 130.

The D flip-flop 141 includes an input terminal D receiving the reference clock signal REFCLK, an output terminal Q, and a clock terminal CK receiving the feedback clock signal FBCLK. The signal A1 output by the output terminal Q is inverted through the inverter 142. A master clock signal RESETB, which is externally supplied for resetting the DLL 1, is inverted through the inverter 144. The NAND gate 143 receives signals output by the inverters 142 and 144, so that a NAND operation is performed to output a first initial state setting signal INTL1. The NAND gate 145 receives the signal A1 output from the output terminal Q and a signal output by the inverter 144, so that NAND operation is performed to output a second initial state setting signal INTL2.

The NAND gate 132 receives the signals UP and DOWN output by the D flip-flops 110 and 120 to perform a NAND operation. The NAND gate 131 receives signals output by the NAND gates 132 and 143, so that a NAND operation is performed to output the signal A2. The NAND gate 133 receives a signal output by the gate 132 and the INTL2 signal output by the NAND gate 145, so that a NAND operation is performed to output the signal A3. The signal A2 output from the NAND gate 131 is applied to a reset terminal RST of the D flip-flop 110, and the signal A3 output from the NAND gate 133 is applied to a reset terminal RST of the D flip-flop 120. Operations of the phase detector 100 according to the first embodiment will now be described in detail with reference to accompanying drawings FIGS. 6A through FIG. 6D.

Figure 6A:
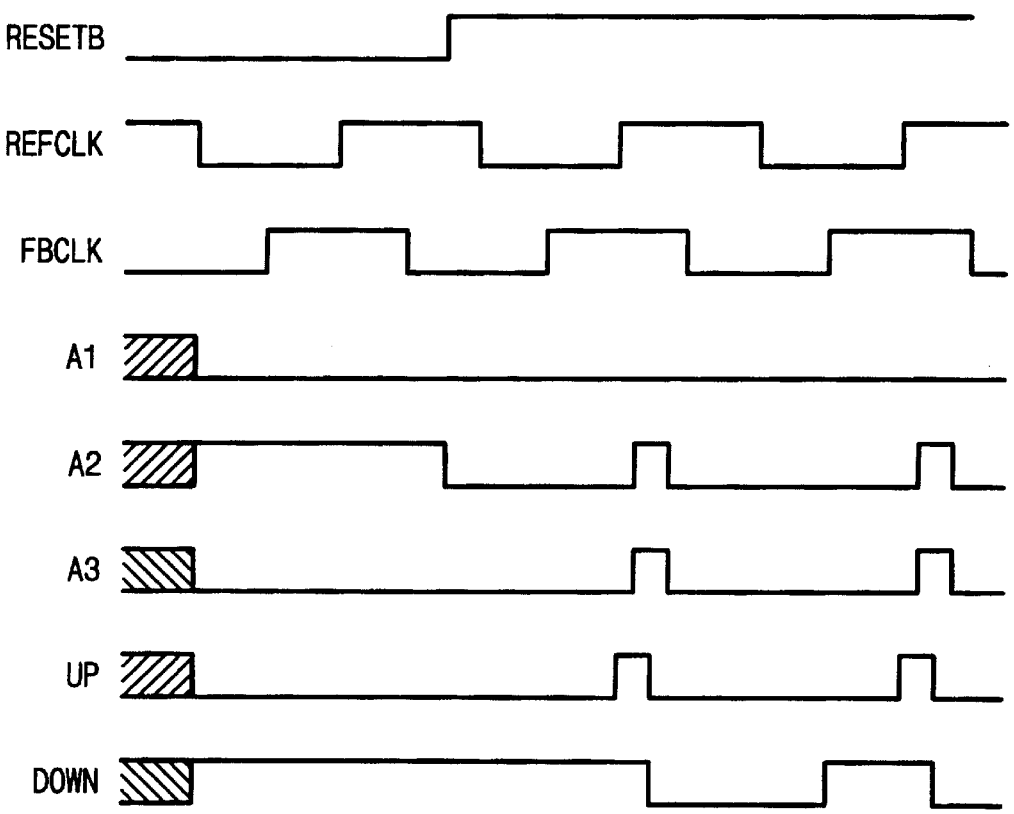
FIG. 6A through FIG. 6D are timing charts showing an operation state of a phase detector according to one embodiment of the present invention.

FIG. 6A through FIG. 6D are timing charts illustrating an operation state of the phase detector 100 shown in FIG. 5 according to the first embodiment. Specifically, FIG. 6A is a timing chart of signals output by the phase detector 100 when the master clock signal RESETB is enabled before the feedback clock FBCLK signal is enabled, i.e., experiences a rising edge, in the case where the phase of the feedback clock signal FBCLK leads the phase of the reference clock signal REFCLK.

Referring to FIG. 5 and FIG. 6A, when the RESETB is in a disable state (i.e., low level or logic "0"), a signal output from the inverter 144 is in a high level (logic "1"). While the phase of the FBCLK leads that of the REFCLK, the REFCLK is at a low level at the rising edge of the FBCLK. Thus, a signal A1 output from the D flip-flop 141 is at a low level, and a signal output from the inverter 142 is therefore at a high level. Since the signals output from the inverters 142 and 144 are at a high level, the NAND gate 143 outputs a first initial state setting signal INTL1 at a low level. Therefore, the signal A2 output by the NAND gate 131 is high irrespective of the output signal of the NAND gate 132. As a result, when the phase of the FBCLK leads the phase of REFCLK, the D flip-flop 110 outputs a phase difference detection signal UP at a low level while the master reset signal RESETB is at a low level.

On the other hand, the NAND gate 145 receives a signal A1 at a low level output by the D flip-flop signal 141 and a high level signal output by the inverter 144 to output a high level signal. By the foregoing operation, the NAND gate 132 outputs a high level signal because the phase difference detection signal UP is at a low level. Since the signal output by the NAND gate 132 and the signal INTL2 output by the NAND gate 145 are at a high level, the NAND gate 133 outputs the signal A3 at a low level. Therefore, the D flip-flop 120 outputs a phase difference detection signal DOWN at a high level in synchronization with the feedback clock signal FBCLK. The phase detector 100 of this invention therefore sets the phase difference detection signals UP and DOWN to a low level and high level, respectively, while the master reset signal RESETB is at a low level, in the case where the phase of the feedback clock signal FBCLK leads a phase of the reference clock signal.

When the RESETB signal transitions to a high level, the output of the inverter 144 goes low. Thus, the NAND gates 143 and 145 output first and second initial state setting signals INTL1 and INTL2 at a high level, respectively. Therefore, the NAND gates 131 and 133 operate depending on the output signal of the NAND gate 132. Since the UP and DOWN are each set to low and high, respectively, a signal output by the NAND gate 132 becomes high level. Accordingly, the signal A2 output by the NAND gate 131 transitions from high to low, and the signal A3 signal output by the NAND gate 133 retains a low level. This allows the D flip-flops 110 and 120 to operate in a non-reset state.

Since the phase difference detection signal DOWN is initially set to a high level, it retains high level at the first rising edge of the FBCLK after the RESETB is enabled. The phase difference detection signal UP is then enabled with a high level at a rising edge of the REFCLK. If both the UP and DOWN signals are at a high level, the signal output by the NAND gate 132 goes low. Thus, the NAND gates 131 and 133 output signals A2 and A3 at a high level, respectively. Each of the D flip-flops 110 and 120 is reset, and each of the DOWN and UP signals output therefrom transition to low. The DOWN signal is enabled at a high level at a second rising edge of the FBCLK after the RESETB is enabled, and the UP is enabled at a high level at a second rising edge of the REFCLK. As both of the UP and DOWN signals are enabled, the signals A2 and A3 output by the NAND gates 131 and 133 go high. Thus, the D flip-flops 110 and 120 are reset and the UP and DOWN signals output therefrom are disabled at a low level.

Figure 1:
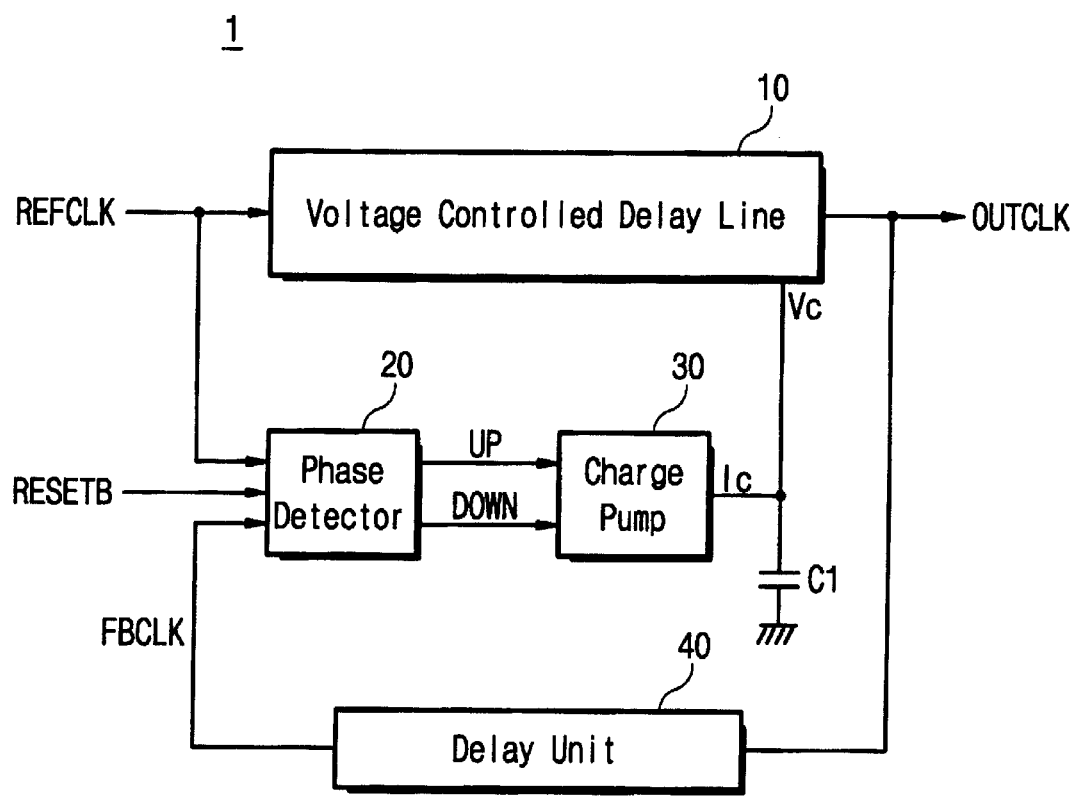
FIG. 1 is a diagram illustrating a conventional delay locked loop.

As a result, returning to FIG. 1, the control voltage Vc corresponding to a phase difference between the UP and DOWN is applied to the VCDL 10, which further delays the REFCLK by an amount of time corresponding to the Vc and outputs the delayed signal of the REFCLK.

Figure 6B:
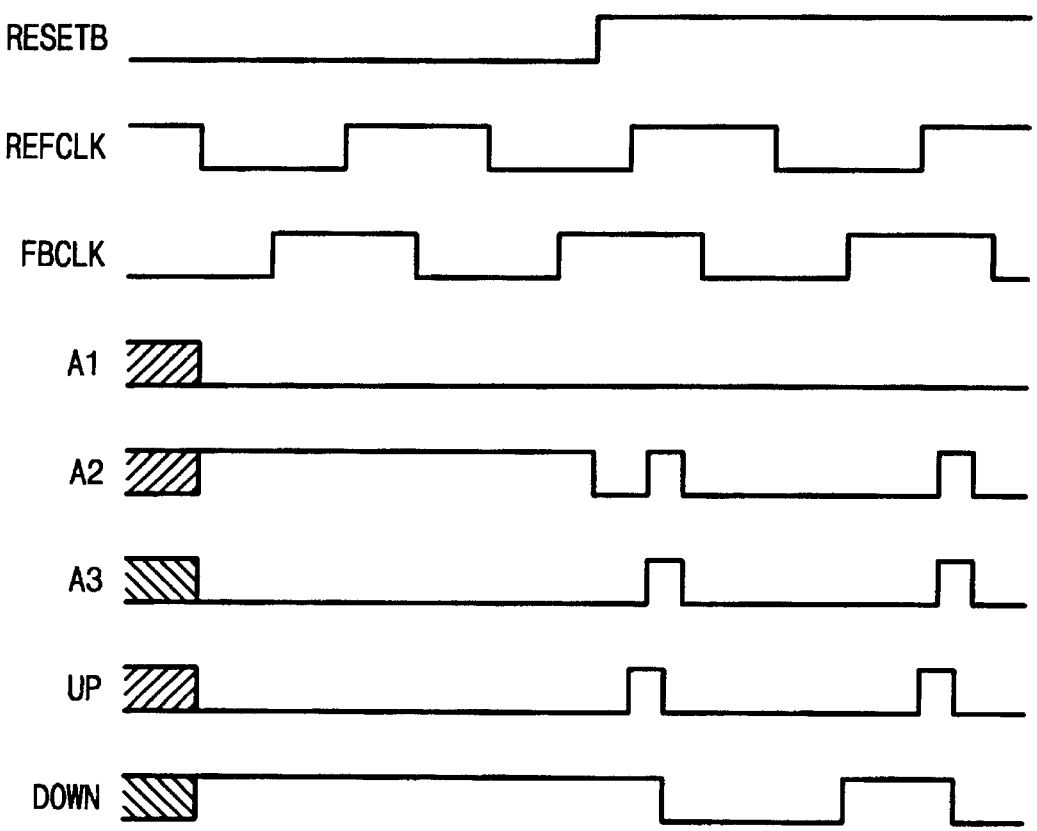

FIG. 6B is a timing chart showing signals output by the phase difference detector 100 in the case where the master clock signal RESETB is enabled between enable times of the reference clock signal REFCLK and the feedback clock signal FBCLK, when the phase of the FBCLK signal leads the phase of the REFCLK signal.

Referring now to FIG. 5 and FIG. 6B, as described with reference to FIG. 6A, the signals A2 and A3 output by the NAND gates 131 and 133 are set to high and low, respectively, while the RESETB is disabled (i.e., at a low level). Thus, the D flip-flop 110 is reset to output a phase difference detection signal UP at a low level, and the D flip-flop 120 is synchronized with the feedback clock signal FBCLK to output a phase difference detection signal DOWN at a high level.

When the RESETB signal transitions to a high level, the output of the inverter 144 goes low. Thus, the NAND gates 143 and 145 output first and second initial state setting signals INTL1 and INTL2 at a high level, respectively. This allows the NAND gates 131 and 133 to operate depending upon the output signal of the NAND gate 132. Since the UP and DOWN signals are initially set to low and high levels, respectively, a signal output by the NAND gate 132 becomes a high level. Accordingly, an A2 signal output by the NAND gates 131 transitions from high to low, and an A3 signal output by the NAND gate 133 retains a low level. This allows both D flip-flops 110 and 120 to operate in a non-reset state.

Since the phase difference detection signal DOWN is initially set to a high level, it retains a high level after the RESETB has transitioned. The phase difference detection signal UP is then enabled at a high level at a first rising edge of the REFCLK after the master reset signal RESETB has transitioned. As both the UP and DOWN signals are enabled, the signals A2 and A3 output by the NAND gates 131 and 133 go high. Thus, each of the D flip-flops 110 and 120 is reset, and both the UP and DOWN signals output therefrom are disabled.

The DOWN signal is enabled to a high level at a first rising edge of the FBCLK after the RESETB signal is enabled, i.e. transitions to a high level, and the UP signal is enabled to a high level at a second rising edge of the REFCLK. As both the UP and DOWN signals are enabled, the signals A2 and A3 output from the NAND gates 131 and 133 go high. Thus, each of the D flip-flops 110 and 120 is reset, and the UP and DOWN signals output therefrom are disabled to a low level.

Therefore, a control voltage Vc corresponding to a phase difference between the UP and DOWN signals is applied to the VCDL 10, which further delays the REFCLK by an amount of time corresponding to Vc.

As mentioned above, the phase detector 100 of this invention generates the phase difference detection signals UP and DOWN based upon a phase relationship between two clock signals REFCLK and FBCLK when the FBCLK signal leads the REFCLK signal. As shown in FIGS. 6A and 6B, the phase detector 100 of this invention correctly operates even if the RESETB is enabled.

Figure 6C:
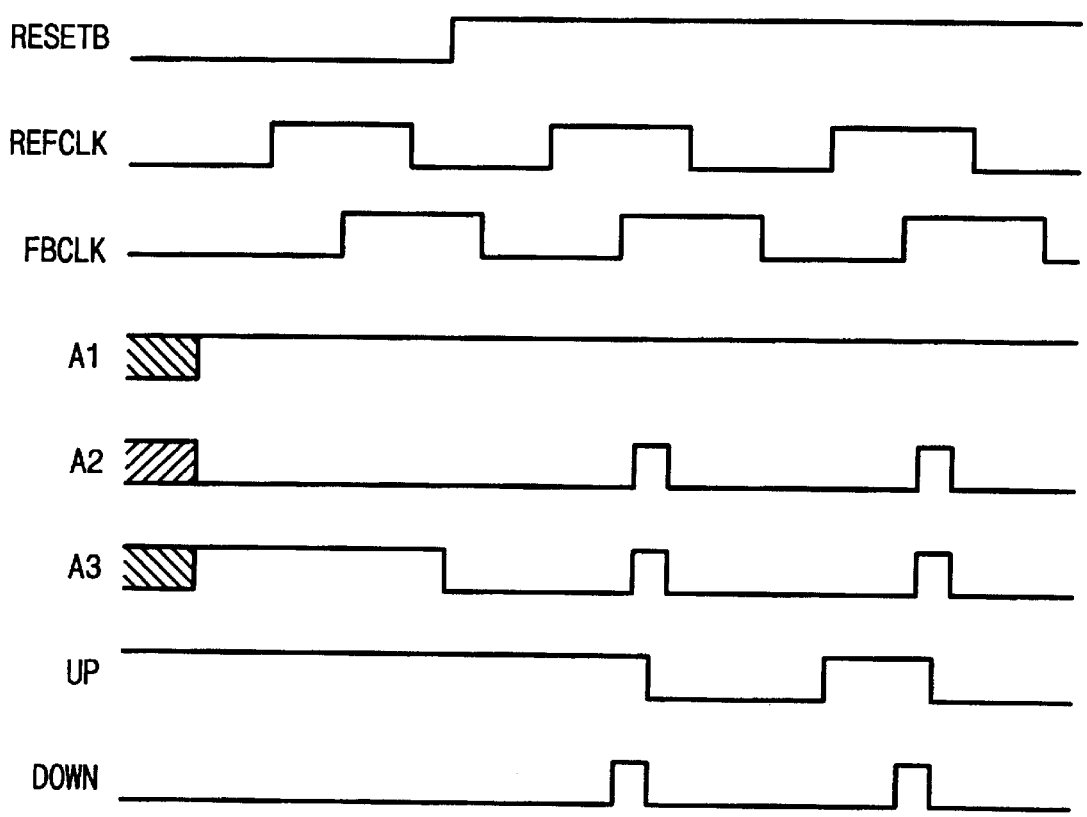

FIG. 6C is a timing chart of signals output from the phase detector 100 in the case where the master clock signal RESETB is enabled before the reference clock signal REFCLK is enabled, when the phase of the feedback clock signal FBCLK lags behind the phase of the REFCLK signal.

Referring to FIG. 5 and FIG. 6C, when the RESETB signal is at a low level, a signal output from the inverter 144 is at a high level. While the phase of the FBCLK lags behind that of the REFCLK, the REFCLK is at a high level at a rising edge of the FBCLK. Thus, a signal A1 output from the D flip-flop 141 becomes a high level and a signal output from the inverter 142 goes low. Therefore, the first initial state setting signal INTL1 output by the NAND gate 143 goes high, and the second initial state setting signal INTL2 output by the NAND gate 145 goes low. A signal A3 output from the NAND gate 133 is high irrespective of the output signal of the NAND gate 132, thereby resetting the D flip-flop 120. As a phase difference detection signal DOWN outputted from the D flip-flop 120 goes low, a signal outputted from the NAND gate 132 goes high. The NAND gate 131 outputs a low level signal, so that the D flip-flop 110 is synchronized with the REFCLK to output a detection signal UP at a high level. When the phase of the FBCLK signal lags behind that of the REFCLK signal, the UP signal is set to a high level and the DOWN signal is set to low level while the RESETB is at low level.

When the RESETB signal becomes a high level, an output of the inverter 144 goes low. Thus, the NAND gates 143 and 145 output first and second initial state setting signals INTL1 and INTL2 at a high level, respectively. The NAND gates 131 and 133 operate depending on an output signal of the NAND gate 132. Since the UP signal is initially set to a high level and the DOWN signal is initially set to low level, a signal at a high level is output from the NAND gate 132. Accordingly, the signal A3 output from the NAND gates 133 transitions from high to low, and the signal A2 outputted from NAND gate 131 retains a low level. This allows both the D flip-flops 110 and 120 to operate in a non-reset state.

Since the phase difference detection signal UP is set to high, it retains a high level at a first rising edge of the REFCLK signal after the RESETB is enabled. The phase difference detection signal DOWN is then enabled to a high level at a rising edge of the FBCLK. When both the UP and DOWN signals are at high levels, a signal output by the NAND gate 132 goes low. Thus, the NAND gate 131 outputs signal A2 at a high level, and the NAND gate 132 outputs signal A3 at a high level. Each of the D flip-flops 110 and 120 is reset, and both the UP and DOWN signals output therefrom transition to low. The UP signal is enabled to a high level at a second rising edge of the REFCLK after RESETB is enabled, and the DOWN signal is enabled to a high level at a second rising edge of the FBCLK. As both the UP and DOWN signals are enabled, the signals A2 and A3 output by the D flip-flops 110 and 120 go high. The D flip-flops 110 and 120 are reset, and both the UP and DOWN signals output therefrom are disabled to a low level.

Therefore, a control voltage Vc corresponding to a phase difference between the UP and DOWN signals is applied to the VCDL 10, which shortens the delay time by an amount of time corresponding to the Vc.

Figure 6D:
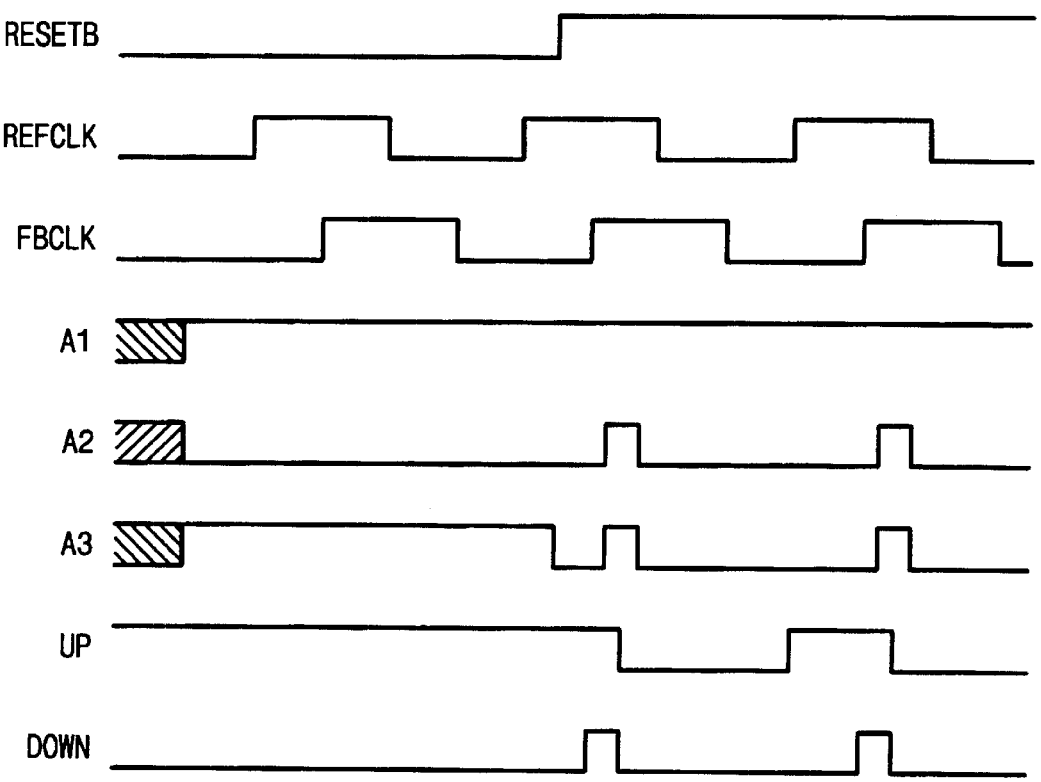

FIG. 6D is a timing chart of signals output by the phase detector 100 in the case where the master clock signal RESETB has transitioned between rising edges of the reference clock REFCLK and the feedback clock FBCLK, when the phase of the FBCLK lags behind the phase of the REFCLK.

Referring to FIG. 5 and FIG. 6D, as mentioned above with reference to FIG. 6C, the signals A2 and A3 output by the NAND gates 131 and 133 are set to low and high, respectively. Therefore, the D flip-flop 120 is reset to output a phase difference detection signal at a low level. The D flip-flop 110 is synchronized with a reference clock signal REFCLK to output a phase difference detection signal UP at a high level.

When the RESETB signal transitions to a high level, an output of the inverter 144 goes low. Thus, the NAND gates 143 and 145 output first and second initial state setting signals INTL1 and INTL2 of high levels, respectively. Accordingly, the NAND gates 131 and 133 operate depending on an output signal of the NAND gate 132. Since the UP signal is initially set to a high level and the DOWN signal is initially set to low level, a signal output by the NAND gate 132 is at a high level. Accordingly, the signal A2 output by the NAND gates 131 is retained at low level, and the A3 signal output from the NAND gate 133 goes low. This allows both D flip-flops 110 and 120 to operate in a non-reset state.

Since the UP signal is initially set to high, the DOWN signal is enabled to a high level at a first rising edge of the FBCLK after the RESETB is enabled. As both the UP and DOWN are enabled, both the signals A2 and A3 output from the NAND gates 131 and 133 go high. Thus, each of the D flip-flops 110 and 120 is reset, and both the UP and DOWN signals output therefrom are disabled to a low level.

The UP signal is enabled to a high level at a first rising edge of the reference clock signal REFCLK after the RESETB signal has transitioned from a low to high level, and the DOWN signal is enabled to a high level at a second rising edge of the feedback clock signal FBCLK after the RESETB has transitioned from low to high. As both the UP and DOWN signals are enabled, the signals A2 and A3 output from the NAND gates 131 and 133 go high. Thus, both the D flip-flops 110 and 120 are reset, and both the UP and DOWN outputted therefrom are disabled with low level.

Therefore, a control voltage Vc corresponding to a phase difference between the UP and DOWN signals is applied to VDCL 10, which shortens the delay time by an amount of time corresponding to the Vc.

As mentioned above, the phase detector 100 of this invention presets the phase difference detection signals UP and DOWN based upon a phase relationship between two clock signals REFCLK and FBCLK when the REFCLK signal leads the feedback clock FBCLK. As shown in FIGS. 6C and 6D, the phase detector 100 of this invention operates correctly regardless of the point of time at which RESETB signal is enabled during the cycle of the REFCLK and FBCLK signals.

Figure 7:
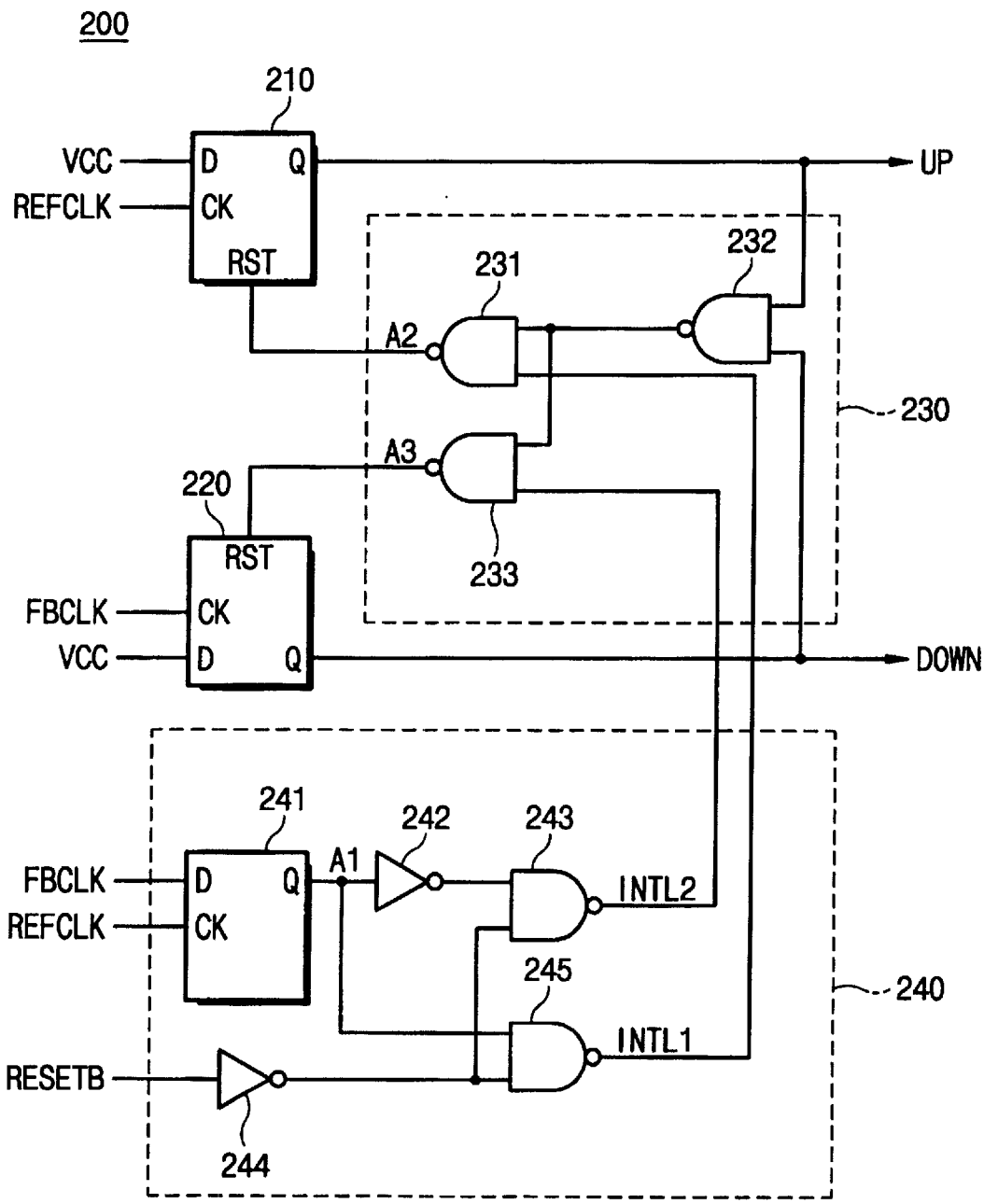
FIG. 7 is a schematic diagram showing a circuit configuration of a phase detector according to another embodiment of the present invention.

FIG. 7 illustrates a circuit configuration of a phase detector 200 according to another embodiment of the present invention. The phase detector 200 includes D flip-flops 210 and 220, a reset control logic 230, and an initial state setting logic 240. The D flip-flops 210 and 220 and the reset control logic 230 have the same circuit configuration as the D flip-flops 110 and 120 and the reset control logic 130 as shown in FIG. 5. Like the initial state setting logic 140 shown in FIG. 5, the initial state setting logic 240 includes a D flip-flop 241, NAND gates 243 and 245, and inverters 242 and 244. However, unlike the initial state setting logic 140, the feedback clock signal FBCLK is applied to the input terminal D and the reference clock signal REFCLK is applied to the clock terminal CK. Furthermore, the signal output by NAND gate 243 is applied to an input of a NAND gate 233, as the second initial state setting signal INTL2, and the signal output from the NAND gate 245 is provided to an input of NAND gate 231, as the first initial state setting signal INTL1. In order to avoid duplicate explanation, a detailed description thereof will be omitted.

Referring to FIG. 7, when the phase of the feedback clock signal FBCLK leads the phase of the reference clock signal REFCLK, signal A1 output by D flip-flop 241 goes high. Therefore, while the master reset signal RESETB is in a low state, a second initial state setting signal INTL2 output from the NAND gate 243 becomes a high level and a first initial state setting signal output from the NAND gate 245 becomes a low level. Signal A2 output by the NAND gate 231 goes high, thereby resetting D flip-flop 210 and setting the phase difference detection signal UP to low. As the UP signal is set to low, the signal output from the NAND gate 232 goes high while the A3 signal output from the NAND gate 233 goes low. Accordingly, D flip-flop 220 outputs a phase difference detection signal DOWN at a high level that is synchronized with a feedback clock signal FBCLK.

In other words, when a phase of the FBCLK leads that of the REFCLK, the UP signal is set to low and the DOWN signal is set to high while the RESETB is at low level. As a result, the phase detector 200 correctly operates regardless of the point of time at which the master reset signal RESETB is enabled.

On the other hand, when the phase of the FBCLK lags behind that of the REFCLK, the A1 signal output from the D flip-flop 241 goes low while the RESETB is at a low level. Thus the signal INTL2 output from the NAND gate 243 becomes a low level and the signal INTL1 output from the NAND gate 245 becomes a high level. The signal A3 output from the NAND gate 233 goes high, so that D flip-flop 220 is reset and phase difference detection signal DOWN is set to low. As the DOWN signal is set to low, a signal output from the NAND gate 232 goes high and the NAND gate 231 outputs a signal A2 at a low level. Therefore, the D flip-flop 210 outputs a phase difference detection signal UP of a high level that is synchronized with the reference clock signal REFCLK.

When the phase of the FBCLK lags behind that of the REFCLK, the UP signal is set to high and the DOWN signal is set to low while the RESETB maintains a low level state. As a result, the phase detector 200 correctly operates regardless of the point of time at which the RESETB is transitioned to a high level.

As explained above, a delay locked loop according to the present invention presets each state of phase differential detection signals irrespective of the phase relationship between the reference clock signal and the feedback clock signal. Independent and separate reset signals are provided to the flip-flops 110, 120, or 210, 220 providing the UP and DOWN signals. Therefore, the phase detector can correctly operate regardless of the point of time at which the master reset signal is transitioned to a high level. In this manner, correct phase locked operation is ensured.

While an illustrative embodiment of the present invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

I claim:

1. A phase detector for a delay-locked loop for compensating for a difference in phase between a first clock signal and a second clock signal, comprising:
   a first flip-flop receiving the first clock signal and generating a first output signal, the first flip-flop being reset by a first reset signal;
   a second flip-flop receiving the second clock signal and generating a second output signal, the second flip-flop being reset by a second reset signal, the first and second reset signals being sourced by separate logic paths; and
   a reset circuit for generating the first reset signal based on a combination of the first and second output signals and a first initialization signal, and for generating the second reset signal based on a combination of the first and second output signals and a second initialization signal, the first and second initialization signals being generated based on a master reset signal generated externally to said phase detector.

2. The phase detector of claim 1 wherein the first and second initialization signals are complementary during an initialization procedure.

3. The phase detector of claim 1 wherein the first clock comprises a reference clock and wherein the second clock comprises a feedback clock.

4. The phase detector of claim 1 wherein the first output signal comprises an UP signal which is used in the delay-locked loop to decrease the delay of the first clock signal and wherein the second output signal comprises a DOWN signal which is used in the delay-locked loop to increase the delay of the first clock signal.

5. The phase detector of claim 1 wherein the reset circuit comprises:
   a first logic circuit for performing a logic operation on the first and second output signals to provide a first intermediate signal;
   a second logic circuit for performing a logic operation on the first intermediate signal and the first initialization signal to generate the first reset signal; and
   a third logic circuit for performing a logic operation on the first intermediate signal and the second initialization signal to generate the second reset signal.

6. The phase detector of claim 1 further comprising an initialization circuit for generating the first and second initialization signals, comprising:
   a third flip-flop receiving the first and second clock signals and generating a second intermediate signal;
   a fourth logic circuit for performing a logic operation on the second intermediate signal and the externally generated master reset signal to generate the first initialization signal; and
   a fifth logic circuit for performing a logic operation on the second intermediate signal and the externally generated master reset signal to generate the second initialization signal.

7. The phase detector of claim 6 wherein the third flip-flop comprises a D flip-flop.

8. The phase detector of claim 7 wherein the first clock signal is coupled to a D input of the third D flip-flop and wherein the second clock signal is coupled to a clock input of the third D flip-flop.

9. The phase detector of claim 7 wherein the second clock signal is coupled to a D input of the third D flip-flop and wherein the first clock signal is coupled to a clock input of the third D flip-flop.

10. The phase detector of claim 1 wherein the first and second flip-flops comprise D flip-flops.

11. The phase detector of claim 10 wherein the first clock signal is coupled to a clock input of the first D flip-flop and wherein the second clock signal is coupled to a clock input of the second D flip-flop and wherein the D inputs of the first and second D flip-flops are each coupled to a voltage source representing a binary one.

12. A phase detector for a delay-locked loop for compensating for a difference in phase between a first clock signal and a second clock signal, comprising:

a first flip-flop receiving the first clock signal and generating a first output signal, the first flip-flop being reset by a first reset signal;

a second flip-flop receiving the second clock signal and generating a second output signal, the second flip-flop being reset by a second reset signal, the first and second reset signals being sourced by separate logic paths; and a reset circuit for generating the first reset signal based on a combination of the first and second output signals and a first initialization signal, and for generating the second reset signal based on a combination of the first and second output signals and a second initialization signal, the first and second initialization signals being generated based on a master reset signal generated externally to said phase detector, wherein the reset circuit comprises:

a first logic circuit for performing a logic operation on the first and second output signals to provide a first intermediate signal;

a second logic circuit for performing a logic operation on the first intermediate signal and the first initialization signal to generate the first reset signal; and a third logic circuit for performing a logic operation on the first intermediate signal and the second initialization signal to generate the second reset signal.

13. The phase detector of claim 12 wherein the first and second initialization signals are complementary during an initialization procedure.

14. The phase detector of claim 12 wherein the first clock comprises a reference clock and wherein the second clock comprises a feedback clock.

15. The phase detector of claim 12 wherein the first output signal comprises an UP signal which is used in the delay-locked loop to decrease the delay of the first clock signal and wherein the second output signal comprises a DOWN signal which is used in the delay-locked loop to increase the delay of the first clock signal.

16. The phase detector of claim 12 further comprising an initialization circuit for generating the first and second initialization signals, comprising:

a third flip-flop receiving the first and second clock signals and generating a second intermediate signal;

a fourth logic circuit for performing a logic operation on the second intermediate signal and the externally generated master reset signal to generate the first initialization signal; and a fifth logic circuit for performing a logic operation on the second intermediate signal and the externally generated master reset signal to generate the second initialization signal.

17. The phase detector of claim 16 wherein the third flip-flop comprises a D flip-flop.

18. The phase detector of claim 17 wherein the first clock signal is coupled to a D input of the third D flip-flop and wherein the second clock signal is coupled to a clock input of the third D flip-flop.

19. The phase detector of claim 17 wherein the second clock signal is coupled to a D input of the third D flip-flop and wherein the first clock signal is coupled to a clock input of the third D flip-flop.

20. The phase detector of claim 12 wherein the first and second flip-flops comprise D flip-flops.

21. The phase detector of claim 20 wherein the first clock signal is coupled to a clock input of the first D flip-flop and wherein the second clock signal is coupled to a clock input of each coupled to a voltage source representing a binary one.

22. A method for compensating for a difference in phase between a first clock signal and a second clock signal, comprising:

receiving the first clock signal and generating a first output signal at a first flip-flop that is reset by a first reset signal;

receiving the second clock signal and generating a second output signal at a second flip-flop that is reset by a second reset signal, the first and second reset signals being sourced by separate logic paths; and generating the first reset signal at a reset circuit that is based on a combination of the first and second output signals and a first initialization signal, and generating the second reset signal based on a combination of the first and second output signals and a second initialization signal, the first and second initialization signals being generated based on a master reset signal generated externally to said phase detector.

23. The method of claim 22 wherein generating the first and second reset signals comprises:

performing a logic operation on the first and second output signals to provide a first intermediate signal;

performing a logic operation on the first intermediate signal and the first initialization signal to generate the first reset signal; and performing a logic operation on the first intermediate signal and the second initialization signal to generate the second reset signal.

24. The method of claim 23 further comprising generating the first and second initialization signals by:

receiving the first and second clock signals and generating a second intermediate signal at a third flip-flop;

performing a logic operation on the second intermediate signal and the externally generated master reset signal to generate the first initialization signal; and performing a logic operation on the second intermediate signal and the externally generated master reset signal to generate the second initialization signal.

* * * * *